United States Patent

Saihara et al.

[11] Patent Number: 5,963,822
[45] Date of Patent: Oct. 5, 1999

[54] METHOD OF FORMING SELECTIVE EPITAXIAL FILM

[75] Inventors: Hidenori Saihara, Kawasaki; Hiroshi Naruse, Yokohama; Hiroyuki Sugaya, Tokyo, all of Japan

[73] Assignee: Kabushiki Kaisha Toshiba, Kawasaki, Japan

[21] Appl. No.: 08/832,779

[22] Filed: Apr. 4, 1997

[30] Foreign Application Priority Data

Apr. 12, 1996 [JP] Japan ..................... 8-090676

[51] Int. Cl.⁶ ..................... H01L 21/20
[52] U.S. Cl. ..................... 438/481; 438/341; 438/416; 438/429
[58] Field of Search ..................... 438/221, 222, 438/309, 341, 364, 405, 413, 416, 429, 481

[56] References Cited

U.S. PATENT DOCUMENTS 4,771,013  9/1988  Curran ..................... 438/313

FOREIGN PATENT DOCUMENTS

| 60-198811 | 3/1984 | Japan . |
| 4-160098 | 10/1990 | Japan . |
| 6-338454 | 5/1993 | Japan . |
| 5-182981 | 7/1993 | Japan . |
| 6-260427 | 9/1994 | Japan . |

*Primary Examiner*—Carl Whitehead, Jr.
*Assistant Examiner*—Khanh Duong
*Attorney, Agent, or Firm*—Finnegan, Henderson, Farabow, Garrett & Dunner, L.L.P.

[57] ABSTRACT

According to a method of fabricating a selective epitaxial film, a thin insulating film serving as a mask is formed on the entire surface of a semiconductor substrate having a (100) plane. An opening portion reaching the semiconductor substrate is formed in a desired region of the thin insulating film. An epitaxial film is selectively grown in the opening portion. The semiconductor substrate having the selective epitaxial film formed thereon is annealed at at least a pressure of 1,000 Pa and at least a temperature of 800° C. to fill a gap on the contact surface between the thin insulating film and the selective epitaxial film.

4 Claims, 6 Drawing Sheets

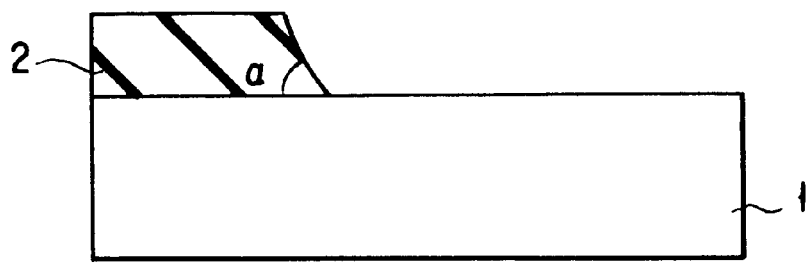
F I G. 4A
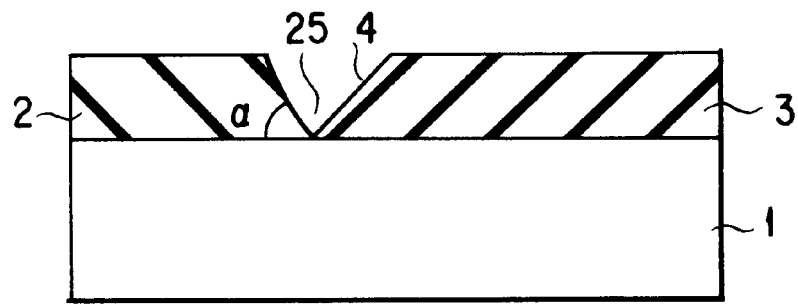
F I G. 4B
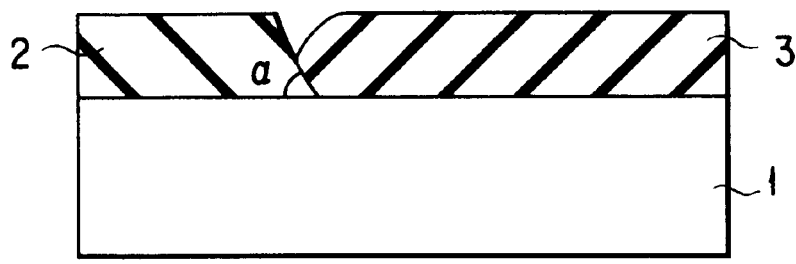
F I G. 4C

METHOD OF FORMING SELECTIVE EPITAXIAL FILM

BACKGROUND OF THE INVENTION

The present invention relates to a method of selectively forming an epitaxial film on a semiconductor substrate by using an insulating film as a mask and, more particularly, to a method of forming a selective epitaxial film which is improved not to form a facet on a selectively formed epitaxial film surface in contact with an insulating film.

Normally in selective epitaxial growth of silicon, an oxide film 42 is formed on the entire surface of a silicon substrate (to be referred to as a (100) silicon substrate hereinafter) 41 having a (100) plane as its surface, as shown in FIG. 1A.

Then, a rectangular opening portion 45 is formed in a desired portion of the oxide film 42 by etching. One side of the rectangular opening portion 45 is in the <100> direction.

A selective epitaxial film 43 is grown to fill the opening portion 45.

However, a (111) facet 44 having a (111) plane as its surface is undesirably formed on the surface of the selective epitaxial film 43 in contact with the oxide film 42, as shown in FIG. 1A.

Next, as shown in FIG. 1B, a polysilicon film 46 serving as, e.g., an electrode region is formed on the (100) silicon substrate 41 to cover both the oxide film 42 and the selective epitaxial film 43 having the (111) facet 44.

In this case, since the (111) facet 44 is formed, the (100) silicon substrate 41 and the polysilicon film 46 which are to be separated by the selective epitaxial film 43 undesirably contact each other and are rendered conductive, or the breakdown voltage therebetween undesirably decreases.

As one method to avoid this, Jpn. Pat. Appln. KOKAI Publication No. 6-260427 discloses the following method.

In this method, a (111) silicon substrate 51 is used, and a selective epitaxial film 53 is grown using an oxide film 52 as a mask, as shown in FIG. 2. According to this method, the surface energy of the (111) silicon substrate 51 having the (111) plane as a surface is low. For this reason, the selective epitaxial film 53 having a flat growth surface without any facet growth can be obtained as shown in FIG. 2.

In this method, however, the plane orientation of the silicon substrate 51 used for epitaxial growth is limited to the (111) plane. This method cannot be applied to the (100) plane used in normal semiconductor devices, and an application range becomes narrow.

As another method, Jpn. Pat. Appln. KOKAI Publication No. 5-182981 discloses the following method.

In this method, an oxide film 62 used as a mask for performing selective epitaxial growth on a (100) silicon substrate 61 is formed to have a special shape, i.e., a hang-over portion 64 on the interface side with a selective epitaxial growth film.

Thereafter, a selective epitaxial film 63 is epitaxially grown using disilane gas.

According to this method, the selective epitaxial film 63 having a flat surface can be obtained to fill a space defined by the side wall of the oxide film 62 and the lower surface of the hang-over portion 64 without any gap by the effect of disilane gas reflected by the lower surface of the hang-over portion 64, as shown in FIGS. 3B to 3D.

It is however very difficult to form the hang-over portion 64 on the oxide film 62.

As described above, it is difficult to obtain the selective epitaxial film 53 having a flat growth surface without any facet growth by using no mask of an oxide film in a special shape such as a hangover shape.

BRIEF SUMMARY OF THE INVENTION

The present invention has been made in consideration of the above situation, and has as its object to provide a method of forming a selective epitaxial film which can grow a selective epitaxial film having a flat growth surface without any facet growth by using no mask of an oxide film in a special shape such as a hangover shape.

To achieve the above object, according to the present invention, there is provided a method of forming a selective epitaxial film, comprising the steps of:

forming a thin film serving as a mask on an entire surface of a semiconductor substrate;

forming an opening portion reaching the surface of the semiconductor substrate in a desired region of the thin film serving as a mask;

selectively forming an epitaxial film in the opening portion; and annealing the semiconductor substrate having the selective epitaxial film formed thereon at a temperature of 800° C. or higher.

Further, according to the present invention, there is provided a method of forming a selective epitaxial film, comprising the steps of:

forming a thin insulating film constituted by any one of a silicon nitride film, a silicon oxide film, and a multilayered film thereof on a semiconductor substrate having a (100) plane as a surface thereof;

forming an opening portion in a desired region of the thin insulating film;

growing a selective epitaxial film in the opening portion; and annealing the semiconductor substrate having the selective epitaxial film formed thereon in a hydrogen atmosphere at a pressure of 1,000 Pa or less and a temperature of 1000 (° C.) or higher.

With the above steps, the method of forming a selective epitaxial film according to the present invention can be improved not to form a facet on a selectively formed epitaxial film surface in contact with an insulating film serving as a mask, independently of the shape of the side surface of the mask used for selective growth of the epitaxial film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4C are partial sectional views, respectively, showing a process of forming a selective epitaxial film according to the first embodiment of the present invention;

DETAILED DESCRIPTION OF THE INVENTION

Figure 1A:
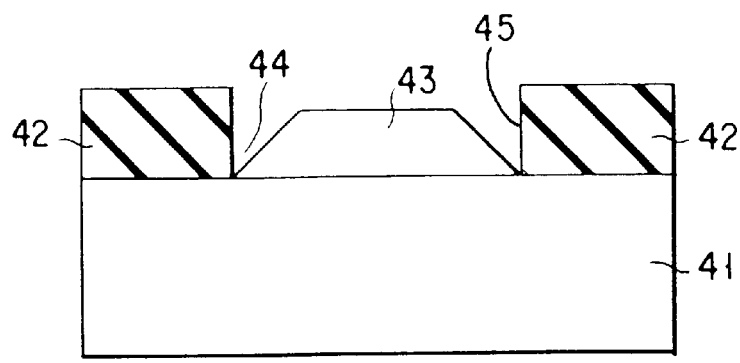
FIG. 1A is a partial sectional view showing a step of forming a selective epitaxial film in the first prior art.
Figure 1B:
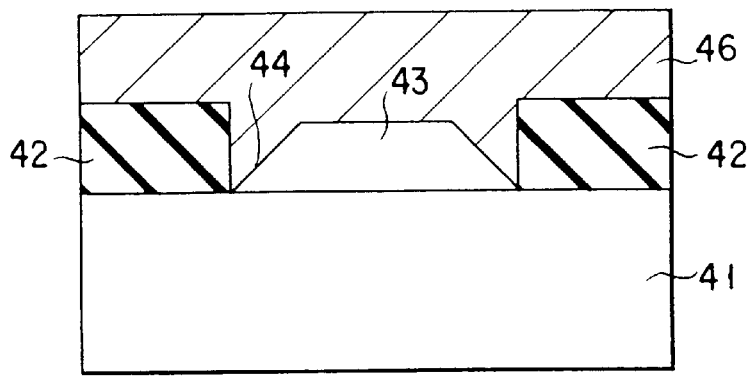
FIG. 1B is a partial sectional view showing a step subsequent to that in FIG. 1A.
Figure 2:
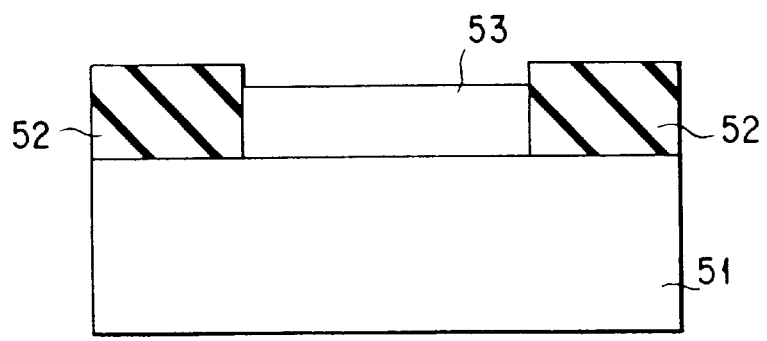
FIG. 2 is a partial sectional view showing a process of forming a selective epitaxial film in the second prior art.
Figure 3A:
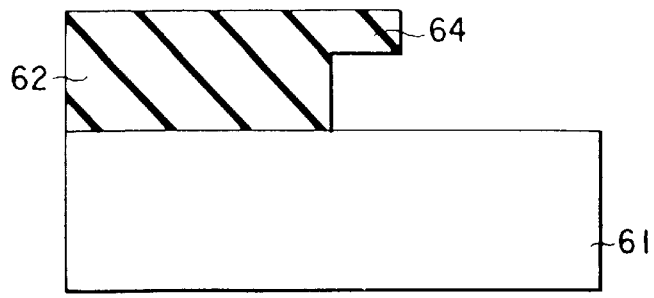
FIGS. 3A to 3D are partial sectional views, respectively, showing a process of forming a selective epitaxial film in the third prior art.
Figure 3B:
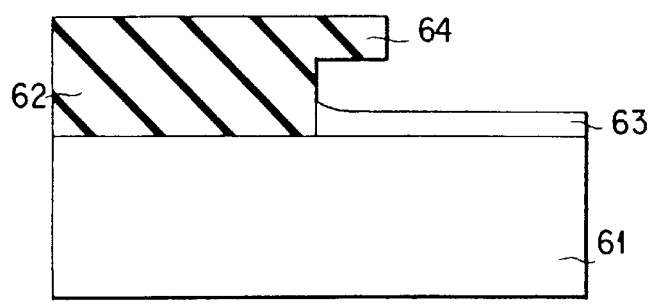
Figure 3C:
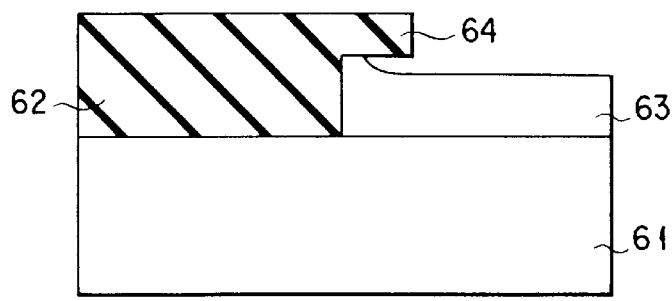
Figure 3D:
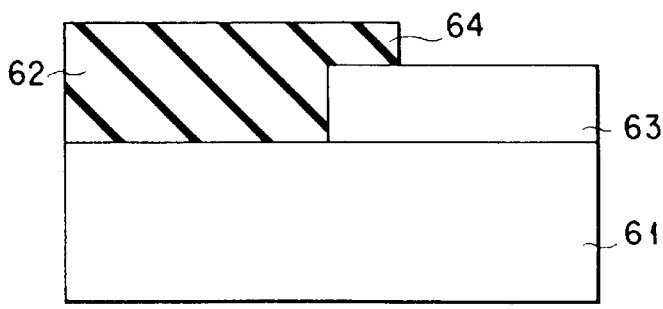

A method of forming a selective epitaxial film according to the first embodiment of the present invention will be described below with reference to FIGS. 4A to 4C.

As shown in FIG. 4A, an oxide film 2 with a film thickness of 200 nm is formed on the entire surface of a (100) silicon substrate 1 by thermally oxidizing the silicon substrate.

After a resist film is formed on the entire surface of the oxide film 2, an opening portion is formed in a desired portion by normal photolithography. The oxide film 2 exposed in this opening portion is etched and removed to form the oxide film 2 having an opening portion on the (100) silicon substrate 1.

As shown in FIG. 4B, silicon epitaxial growth is performed using the oxide film 2 as a mask to form a 70-nm silicon selective epitaxial film 3. At this time, the silicon selective epitaxial film 3 normally has the following shape at the interface in contact with the oxide film 2 though this shape changes depending on the growth conditions of epitaxial growth and the shape of the side surface of the opening portion of the oxide film 2.

That is, when an angle a defined by the side surface of the opening portion of the oxide film 2 and the surface of the (100) silicon substrate 1 is 90° or more, the selective epitaxial film 3 is formed in tight contact with the oxide film 2, as shown in FIG. 4C.

When, however, α is less than 90°, the silicon selective epitaxial film 3 having a (111) facet 4 on its side surface on the oxide film 2 side can be obtained, as shown in FIG. 4B.

At this time, a gap 25 is often formed at the interface of the (111) facet 4 and the oxide film 2.

Silicon selective epitaxial growth at this time is performed by flowing a carrier gas of $H_2$ at a flow rate of 15 l/min and a source gas of $SiH_2Cl_2$ at a flow rate of 0.4 l/min at a temperature of 700° C. and a pressure of 1,000 Pa.

Subsequent to this selective epitaxial growth, annealing is performed in an atmosphere at a temperature of 1,000° C., an $H_2$ gas pressure of 1,000 Pa, and an impurity gas partial pressure of $1\times10^{-4}$ Pa or less for 30 sec.

At this time, it was confirmed that the (111) facet 4 of the silicon selective epitaxial film 3 formed at the interface with the oxide film 2 was filled by the silicon selective epitaxial film 3 to eliminate the gap 25, as shown in FIG. 4C.

In this manner, the side surface of the oxide film 2 directly contacts the side surface of the selective epitaxial film 3 without any gap regardless of the shape of the interface of the oxide film 2 and the selective epitaxial film 3.

This phenomenon was observed when annealing was performed in an $H_2$ gas atmosphere at 800° C. or higher. It is considered that atoms in the surface of the epitaxial growth layer are activated at a high temperature of 800° C. or higher and move through the surface of the epitaxial layer.

Next, a method of forming a selective epitaxial film according to the second embodiment of the present invention will be described with reference to FIGS. 5A to 5I.

The second embodiment exemplifies a case wherein a selective epitaxial film is applied to the base epitaxial film of a bipolar transistor.

Figure 5A:
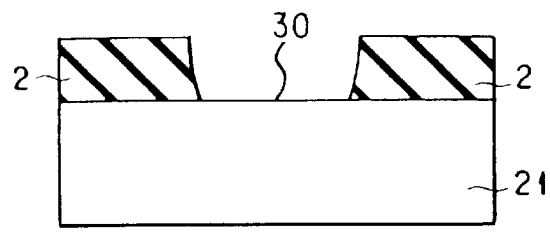
FIGS. 5A to 5I are partial sectional views, respectively, showing a process of forming a selective epitaxial film according to the second embodiment of the present invention.

Referring to FIG. 5A, a thermal oxide film 2 with a thickness of 200 nm is selectively formed on an n-type (100) silicon epitaxial growth substrate 21 which serves as a collector region and is doped with P (Phosphorus) at about $3\times10^{16}$ cm$^{-2}$, and an opening portion 30 is formed in this desired region of the thermal oxide film 2.

A p-type selective epitaxial film 23 which serves as a base region and is doped with B (Boron) at about $7\times10^{18}$ cm$^{-2}$ is formed to a thickness of 70 nm.

Figure 5B:
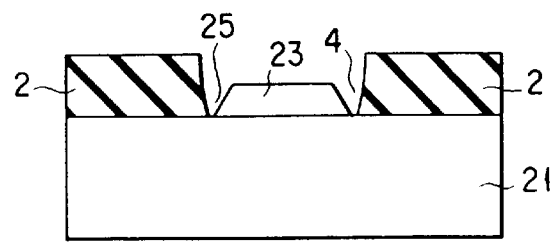

Accordingly, a (111) facet 4 is formed on the side surface of the p-type selective epitaxial film 23 on the oxide film 2 side, and a gap 25 is partially formed (FIG. 5B).

Figure 5C:
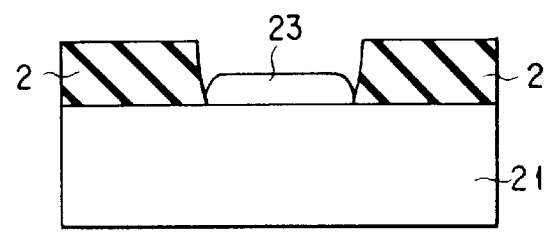

Next, annealing is performed in an atmosphere at a temperature of 1,000° C., an $H_2$ gas pressure of 1,000 Pa, and an impurity gas partial pressure of $1\times10^{-4}$ Pa or less for 30 sec to fill the gap 25 (FIG. 5C).

Figure 5D:
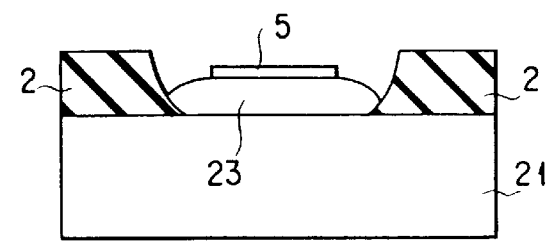

The p-type silicon selective epitaxial film 23 is thermally oxidized to form a second silicon oxide film 5 at only the desired portion (FIG. 5D).

Figure 5E:
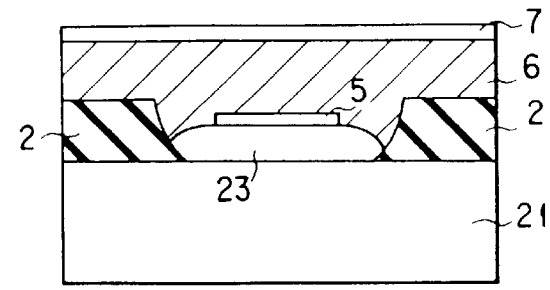

Subsequently, a p-type polysilicon film 6 serving as a base electrode is formed by doping B at about $5\times10^{18}$ cm$^{-2}$ to cover the oxide film 2, the p-type selective epitaxial film 23, and the second silicon oxide film 5. Further, a third oxide film 7 is formed on the surface by thermal oxidation (FIG. 5E).

Figure 5F:
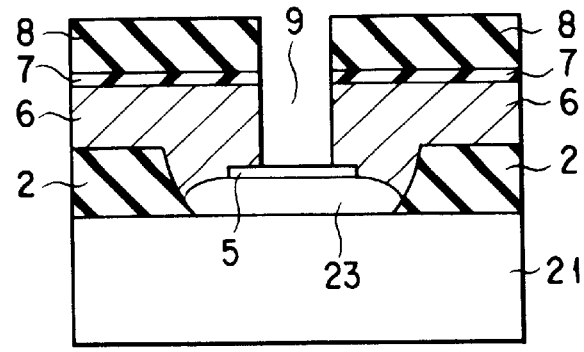

After a first nitride film 8 is formed on the entire surface, an etching hole 9 is formed to extend from the wafer surface to the second silicon oxide film 5 through the first nitride film 8, the third oxide film 7, and the p-type polysilicon film 6 (FIG. 5F).

Figure 5G:
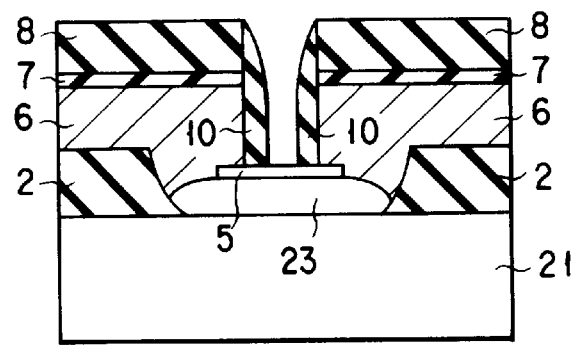

Then, a second nitride film is formed on the entire surface of the wafer, and etched back to form nitride film side walls 10 on the side walls of the etching hole 9 (FIG. 5G).

Figure 5H:
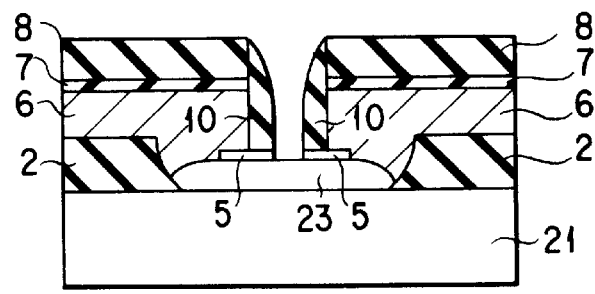

Furthermore, the second silicon oxide film 5 exposed at the bottom portions of the nitride film side walls 10 is removed by wet etching to expose the surface of the silicon selective epitaxial film 23 (FIG. 5H).

An n-type polysilicon emitter electrode 11 doped with As (Arsenic) is formed to cover the surface of the nitride film side walls 10, the surface of the silicon selective epitaxial film 23 exposed at the bottom portion of the nitride film side wall 10, and further the surface of the first nitride film 8.

Figure 5I:
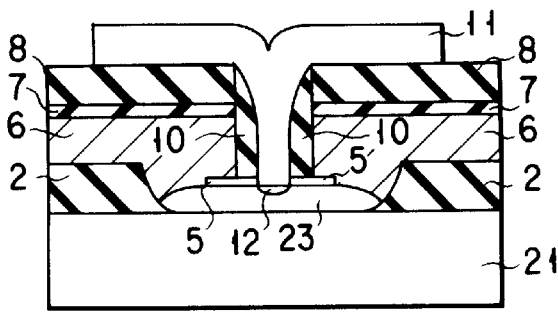

Annealing is performed to diffuse As (Arsenic) from the n-type polysilicon emitter electrode 11 into a portion, of the surface of the p-type selective epitaxial film 23, in contact with the n-type polysilicon emitter electrode 11, thereby forming an n-type emitter region 12 (FIG. 5I).

According to the above-described embodiments, a gap between the silicon oxide film 2 and the selective epitaxial film 3 or 23 is filled upon annealing, and an error as described above does not occur, thereby greatly improving the manufacturing yield of transistors.

Next, the third embodiment of the present invention in which the present invention is applied to element isolation will be described with reference to FIGS. 6A to 6C.

Figure 6A:
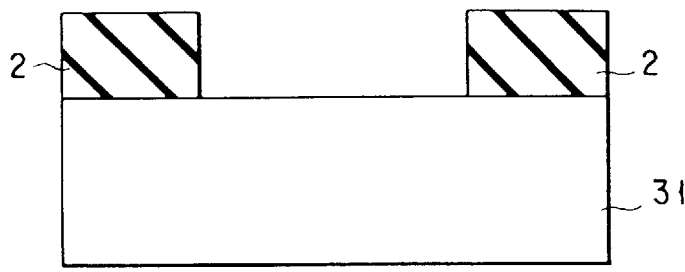
FIGS. 6A to 6C are partial sectional views, respectively, showing a process of forming a selective epitaxial film according to the third embodiment of the present invention.
Figure 6B:
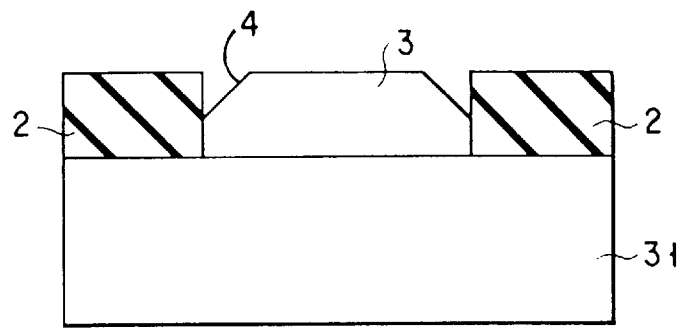

Referring to FIG. 6A, a 1,000-nm oxide film 2 is partially formed on a p-type silicon substrate 31, and an opening portion is formed using the oxide film 2 as a mask. An n-type selective epitaxial film 3 is grown on the exposed surface of the p-type silicon substrate 31 to a relatively large thickness of 1,000 nm. The silicon selective epitaxial film 3 serves as an electrically isolated device formation region (FIG. 6B).

In the use of, e.g., a (100) substrate for the p-type silicon substrate 31, however, even if the end surface of the oxide film 2 is formed vertical, a step is formed at the interface of the n-type silicon selective epitaxial film 3 and the oxide film 2 due to formation of a (111) facet 4.

This step causes disadvantages such as mask misalignment and resist coating nonuniformity in a photolithography step when a device is formed on the surface of the selective epitaxial film 3.

Figure 6C:
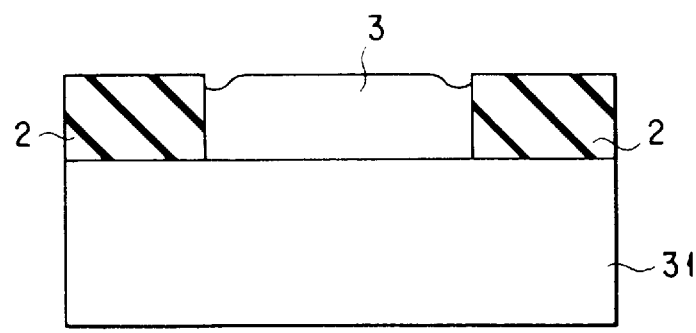

According to the present invention, however, the step is planarized by annealing at 800° C., and a state suitable for device fabrication can be obtained (FIG. 6C).

According to the third embodiment described above, a flat surface without almost any facet can be easily obtained, and high-precision processing can be performed with respect to the selective epitaxial film.

The above-described embodiments exemplify the case wherein selective epitaxial growth is performed on the silicon substrate. The present invention is not limited to the respective embodiments, and can be applied in a wide condition range.

The selective epitaxial film need not consist of the same material as that of the semiconductor substrate. For example, a selective epitaxial film consisting of a silicon-germanium mixed crystal may be formed on a silicon substrate.

The atmosphere of annealing is not limited to an $H_2$ atmosphere, and may be a non-oxidizing atmosphere such as an $N_2$ or Ar atmosphere so as to prevent oxidation of the surface of the semiconductor substrate.

In the respective embodiments, a silicon oxide film is used as a selective growth mask. The present invention is not limited to this, and a silicon nitride film or the like may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of fabricating a selective epitaxial film, comprising the steps of:

forming an insulating film serving as a mask on an entire surface of a semiconductor substrate having a (100) plane;

forming an opening portion reaching said semiconductor substrate in a region of said insulating film;

selectively growing an epitaxial film in the opening portion to form a facet on a surface of the selectively grown epitaxial film; and annealing said semiconductor substrate having said selective epitaxial film formed thereon at at least a pressure of 1,000 Pa and at least a temperature of 800° C. at which the surface of the epitaxial layer deforms, to fill a gap on a contact surface between said insulating film and said epitaxial film.

2. A method according to claim 1, wherein the annealing step is performed at a temperature of 1,000° C. for about 30 sec.

3. A method of fabricating a bipolar transistor including a base epitaxial film, comprising the steps of:

forming a first oxide film serving as a mask on an entire surface of a semiconductor substrate which serves as a collector region and has a (100) plane;

forming an opening portion reaching said semiconductor substrate in a region of said first oxide film;

selectively growing an epitaxial film in the opening portion;

annealing said semiconductor substrate having said selective epitaxial film formed thereon at least a pressure of 1,000 Pa and at least a temperature of 800° C. to fill a gap on a contact surface between said first oxide film and said selective epitaxial film;

annealing said grown epitaxial film to partially form a second oxide film;

forming a polysilicon film serving as a base electrode to cover said first oxide film, said selective epitaxial film, and said second oxide film, and further forming a third oxide film on said polysilicon film;

forming, after forming a nitride film on an uppermost surface, a hole portion to extend through said nitride film, said third oxide film, said polysilicon film, and said second oxide film;

forming a nitride film side wall on a side wall of the hole portion;

removing by etching said second oxide film exposed on a bottom surface of the hole portion surrounded by said side wall, thereby exposing said selective epitaxial film in the hole portion;

forming an emitter electrode to cover a surface of said nitride film, said nitride film side wall, and said selective epitaxial film exposed in the hole portion; and forming an emitter region by diffusion at a portion, of a surface of said selective epitaxial film, which contacts said emitter electrode.

4. A method of forming an element isolation region in a semiconductor element, comprising the steps of:

forming an oxide film serving as a mask on an entire surface of a semiconductor substrate having a (100) plane;

forming an opening portion in a desired region of said oxide film to expose said surface of said semiconductor substrate;

selectively growing an epitaxial film in the opening portion; and annealing said semiconductor substrate having said selective epitaxial film formed thereon at at least a temperature of 800° C. to fill a gap on a contact surface between said oxide film and said selective epitaxial film.

* * * * *

UNITED STATES PATENT AND TRADEMARK OFFICE
CERTIFICATE OF CORRECTION

PATENT NO.: 5,963,822

DATED: October 5, 1999

INVENTOR(S): Hidenori Saihara et al.

It is certified that an error appears in the above-identified patent and that said Letters Patent is hereby corrected as shown below:

Claim 1, Column 6, line 1, after "800°C.", insert --,--.

Signed and Sealed this

First Day of August, 2000

Attest:

Q. TODD DICKINSON

*Attesting Officer*      *Director of Patents and Trademarks*

UNITED STATES PATENT AND TRADEMARK OFFICE
CERTIFICATE OF CORRECTION

PATENT NO. : 5,963,822
DATED : October 5, 1999
INVENTOR(S) : Hidenori Saihara et al.

It is certified that error appears in the above-identified patent and that said Letters Patent is hereby corrected as shown below:

Column 6,
Line 1, after "800°C.", insert -- , --.
Line 20, after "thereon", insert -- at --.

Signed and Sealed this

Tenth Day of February, 2004

JON W. DUDAS
*Acting Director of the United States Patent and Trademark Office*